United States Patent [19]

Cherry

[11] 4,243,943
[45] Jan. 6, 1981

[54] FEEDBACK SYSTEMS

[75] Inventor: Edward M. Cherry, Glen Waverley, Australia

[73] Assignee: Monash University, Clayton, Australia

[21] Appl. No.: 929,793

[22] Filed: Jul. 31, 1978

[30] Foreign Application Priority Data

Feb. 1, 1978 [AU] Australia .............................. PD3221

[51] Int. Cl.³ .............................................. H03F 1/34
[52] U.S. Cl. .................................... 330/100; 330/103; 330/107; 330/294
[58] Field of Search ................... 330/98, 99, 100, 103, 330/107, 109, 291, 293, 294

[56] References Cited

U.S. PATENT DOCUMENTS

| 2,281,238 | 4/1942 | Greenwood | 330/100 X |
| 2,397,625 | 4/1946 | Roche et al. | 330/100 X |
| 3,512,102 | 5/1970 | Kubach | 330/100 X |

FOREIGN PATENT DOCUMENTS

| 144125 | 3/1948 | Australia | 330/100 |
| 729827 | 5/1955 | United Kingdom | 330/100 |

Primary Examiner—James B. Mullins
Attorney, Agent, or Firm—Schwartz, Jeffery, Schwaab, Mack, Blumenthal & Koch

[57] ABSTRACT

A feedback system for a multi-stage amplifier is disclosed which includes a nest of feedback loops centered on a particular stage, for example, on the output stage. This enables a very large amount of feedback to be applied to that stage, and enables constant return difference to be obtained for that stage over a nominated frequency range. Bode's limits for mid-band loop-gain magnitude and its rate of attenuation with frequency can be exceeded.

42 Claims, 9 Drawing Figures

FEEDBACK SYSTEMS

BACKGROUND OF THE INVENTION

This invention relates to feedback systems wherein nonlinear distortion is reduced to very low levels. It relates particularly but not exclusively to electronic negative-feedback amplifiers for use in sound-reproducing apparatus.

Embodiments of the invention can also reside in integrated-circuit operational amplifiers, in which an outer feedback loop is provided by the user and the inner feedback loops are provided within the integrated circuit. Embodiments of the invention can also reside in instrumentation amplifiers in which extremely low integral and differential nonlinearity are required. Embodiments can also form the basis for repeater amplifiers in telecommunication channels, in which extremely low intermodulation distortion is required. The invention also has application in feedback systems such as used in magnetic amplifiers, hydraulic amplifiers, pneumatic amplifiers, mechanical amplifiers and like signal processing apparatus. Other applications will be apparent to an electronic addressee.

A problem with many types of amplifier is nonlinear distortion. Common specifications include harmonic distortion and intermodulation distortion. A standard method for reducing nonlinear distortion in an amplifier is to apply negative feedback to it.

H. W. Bode (see Bode H. W. "Network Analysis and Feedback Amplifier Design", Van Nostrand, Princeton N.J. 1947) has derived well-known limits to the amount of feedback that can be applied to a single-loop amplifier and some multi-loop amplifiers. Bode's rule for a single-loop low-pass amplifier is that loop gain should not be rolled off faster than about 30 dB/decade if the amplifier is to be unconditionally stable. Conservative practice often restricts the roll-off to 20 dB/decade. Therefore the amount of feedback which could be successfully applied and the consequent reduction in distortion were hitherto limited.

BRIEF SUMMARY OF THE INVENTION

It is an object of the present invention to provide a circuit arrangement whereby Bode's feedback limits for mid-band loop-gain magnitude and its rate of attenuation with frequency can be exceeded, so that the amount of distortion can be further reduced.

In one form of the present invention there may be provided a multi-stage amplifier which constitutes the forward path of a feedback amplifier and a number of feedback networks each of transfer function in complex frequency notation of the approximate form $s\tau$ for a low-pass amplifier, or $1/s\tau$ for a high-pass amplifier, or $[s\tau + 1/s\tau]$ for a band-pass amplifier, or $1/[s\tau + 1/s\tau]$ for a band-stop amplifier, said feedback networks being so arranged that the resulting feedback loops form a nest, one inside another.

In the case of a low-pass amplifier it will be appreciated that said feedback networks each feed back a time derivative of the signal at some point in the forward path to some earlier point.

Most preferably the poles and zeros of the individual stages of said forward path are so chosen that each feedback loop, with all other loops enclosed by it operating, is unconditionally stable.

DESCRIPTION OF PREFERRED EMBODIMENTS

Figure 1:
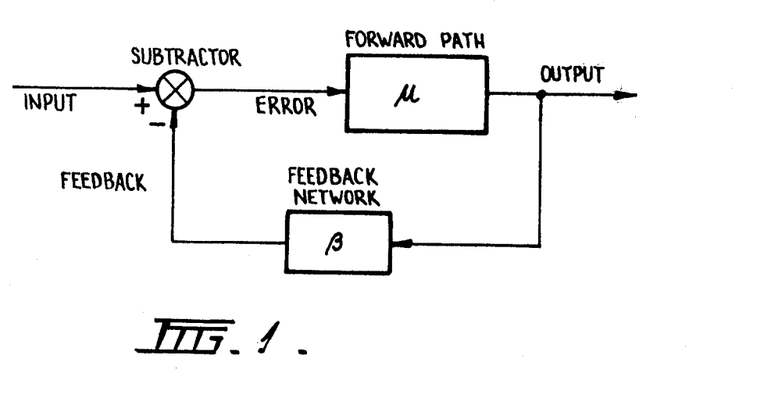
FIG. 1 is a block diagram of a prior-art single-loop feedback amplifier.

FIG. 1 is the block diagram of a single-loop feedback amplifier with forward path $\mu$ and feedback network $\beta$. The overall gain A is $$A = \frac{\text{OUTPUT}}{\text{INPUT}} = \frac{\mu}{1 + \mu\beta} \qquad (1)$$

The return difference F and loop gain $A_1$ are defined by $$F = 1 + A_1 = 1 + \mu\beta. \qquad (2)$$

If the loop gain is large, then $$A \rightarrow 1/\beta \qquad (3)$$

independent of the forward-path gain $\mu$. In particular, the effect of nonlinearity in the forward path $\mu$ is reduced in the overall gain A.

If the amplifier without feedback (corresponding to $\mu$) has n-th harmonic distortion $D_n(j\omega)$ at a particular signal frequency $\omega$ and amplitude, its distortion when feedback is applied (corresponding to the distortion in A) at the same signal frequency and output amplitude is $$D_n^*(j\omega) \simeq \frac{D_n(j\omega)}{F(jn\omega)} \qquad (4)$$

where $F(jn\omega)$ is the return difference at the frequency of the n-th harmonic. Distortion reduction by feedback is limited only by the return difference available at the relevant frequency.

Figure 2:
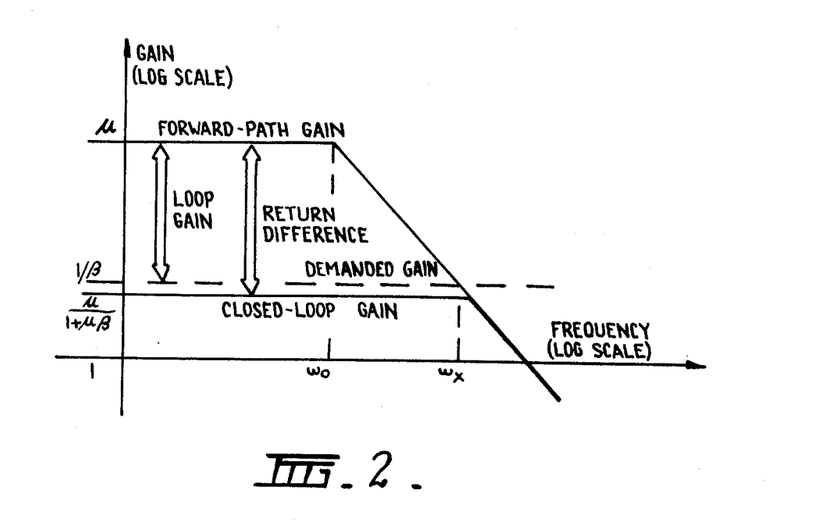
FIG. 2 is a graph of gain asymptotes of a prior-art single-loop low-pass feedback amplifier, on a log scale.

FIG. 2 shows the asymptotes of the forward-path gain, feedback factor, and overall gain of a single-loop low-pass feedback amplifier, graphed versus frequency on logarithmic scales. In a low-pass amplifier the forward-path gain falls with increasing frequency, and the angular frequency at which the asymptote departs from its mid-band value $\mu$ is designated in FIG. 2 by $\omega_0 = 1/\tau_0$.

When two quantities are graphed on logarithmic scales, the separation between the curves gives the quotient of the quantities. The arrows in FIG. 2 therefore give the loop gain and return difference, and the variations in length of these arrows at different frequencies give the variations of loop gain and return difference with frequency. In FIG. 2 the asymptotes of both loop gain and return difference are constant at all frequencies up to $\omega_0 = 1/\tau_0$, and loop gain fall through unity at $\omega_X = 1/\tau_X$.

Because return difference in a low-pass amplifier falls with increasing frequency, nonlinear distortion must increase with increasing frequency above $\omega_0$, in accordance with Eq. 4. If the conservative 20 dB/decade limit to loop-gain roll-off is observed, it follows from the geometry of FIG. 2 that $$F = 1 + \frac{\omega_X}{\omega_0} = 1 + \frac{\tau_0}{\tau_X} \tag{5}$$

As an example, consider a transistorized amplifier for use in a sound-reproducing system. In this application it is the distortion terms at frequencies up to about $10^5$ radian/sec (roughly 20 kHz) that matter. Accordingly a design objective in such cases is to maximize the feedback up to this frequency.

The unity-loop-gain frequency $\omega_X$ is chosen having regard to the gain-bandwith product $\omega_T$ of the transistors and the difficulty of controlling the loop phase shift at high frequencies. For audio amplifiers the median value would be about $10^6$ radian/sec. It follows from FIG. 2 and the conservative 20 dB/decade loop-gain roll-off that return difference at 20 kHz in a single-loop amplifier cannot exceed about 10 (20 dB) irrespective of how $\omega_0$ is chosen, and cannot exceed 100 (40 dB) at 2 kHz. Reduction in second-harmonic distortion by feedback for a 10-kHz signal therefore cannot exceed 10, or 100 for 1 kHz. An amplifier which claims a return difference and distortion reduction of 1000 (60 dB) must have $\omega_0$ chosen as about 1000 radian/sec (roughly 200 Hz); second-harmonic distortion must begin rising above 100 Hz, and the foregoing reductions of distortion at 1 kHz and 10 kHz, 100 and 10 respectively, still apply. The rise of distortion at high audio frequencies gives many audio amplifiers a characteristic "hard" sound.

If a single-loop feedback amplifier is required to have constant distortion over the audio bandwidth, then $\omega_0$ must be chosen as about $10^5$ radian/sec (20 kHz). The allowed maximum $\omega_X$ then sets the maximum return difference and reduction in distortion (Equations 4 and 5). If a large reduction in distortion is required, then $\omega_X$ must be raised above its norm of around $10^6$ radian/sec, and the resulting difficulty with loop phase shift at high frequencies must be accepted. As shown by Bode, introducing local resistive feedback networks around individual stages can at best leave this conclusion unchanged.

Figure 3:
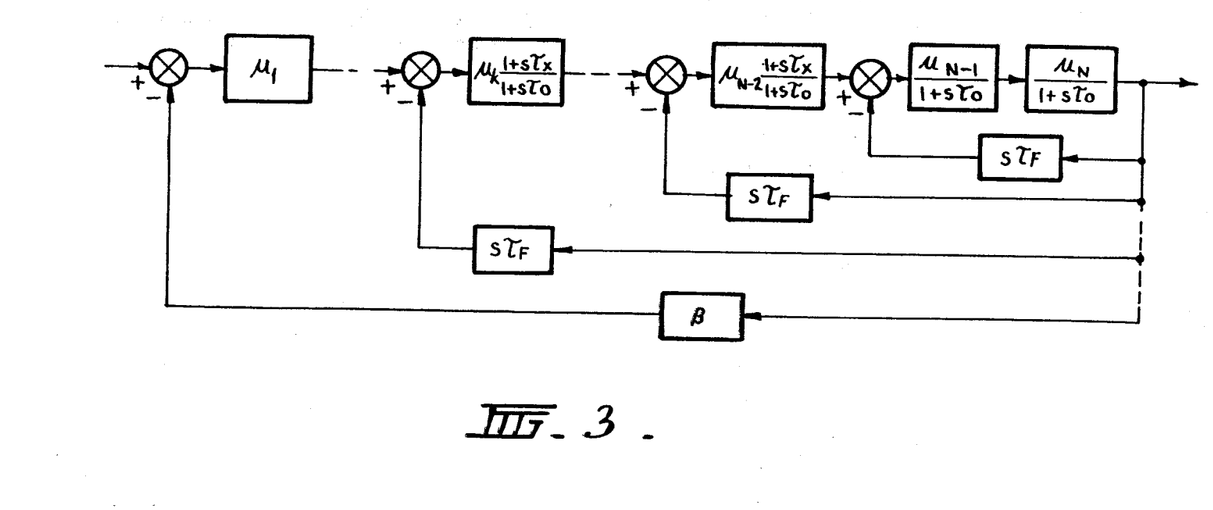
FIG. 3 is a block diagram of the low-pass form of the preferred embodiment of the present invention.

The present invention relates to a new feedback structure, having a nest of feedback loops, such as the preferred embodiment shown in FIG. 3 for its low-pass form. With this structure an extremely large amount of feedback can be applied to the stages at the centre of the nest, with the benefit of reduced nonlinearity compared with prior amplifiers. The gain around each loop must obey Bode's 30-odd dB/decade rule if the amplifier is to be unconditionally stable. However the return difference for any stage is the product of the return differences of all loops which enclose that stage, and for the stages at the centre of the nest this product can exceed Bode's limit. The designer can freely and independently choose $\omega_0$, $\omega_X$, and return difference for the stages at the centre of the nest.

In a single-loop feedback amplifier the loop gain $A_1 = \mu\beta$ can (in principle) be measured by breaking the loop at any point. Return difference F is defined as $$F = \frac{\text{ERROR, feedback removed}}{\text{ERROR, feedback applied}} \tag{6}$$

for constant system INPUT, and has the value already given, viz, $$F = 1 + \mu\beta = 1 + A_1. \tag{7}$$

All stages in the forward path have the same return difference. In the multi-loop structure of FIG. 3, k-th-stage return difference is $$F_K = \frac{\text{INPUT to } k\text{-th stage, all feedback removed}}{\text{INPUT to } k\text{-th stage, all feedback applied}} \tag{8}$$

for constant system INPUT. All stages do not have the same return difference.

For simplicity of explanation, FIG. 3 is a special case of a more general structure:
(i) stages 2 through N have a pole at $1/\tau_0$;
(ii) stages 2 through N−2 have a zero at $1/\tau_X$;
(iii) stages 2 through N−2 have $$\mu_k = \tau_0/\tau_X; \tag{9}$$

(v)

$$\tau_F = \mu_1 \beta \tau_X. \tag{11}$$

It will be apparent to an electronic addressee that these constraints are not essential to the invention.

Figure 4:
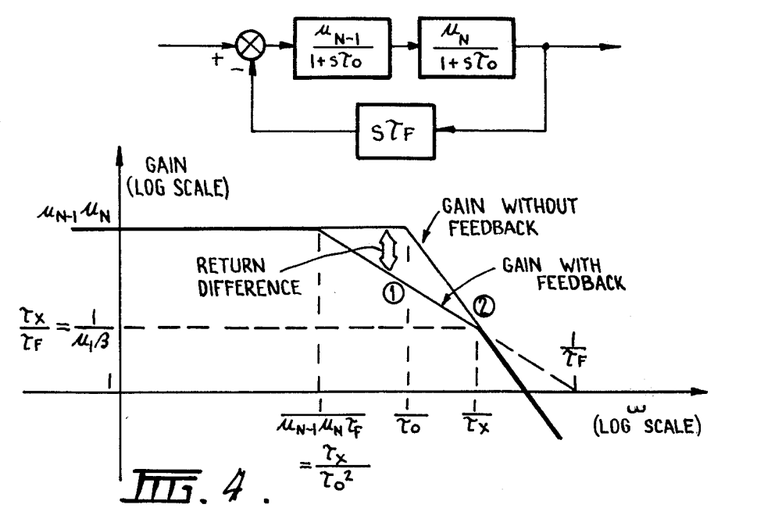
FIG. 4 is a graph showing the gain asymptotes of stages N-1 and N of the low-pass form of a preferred embodiment, on a log scale.

FIG. 4 shows the gain asymptotes of stages N−1 and N with the inner or (N−1)-th feedback factor $s\tau_F$. At low frequencies the loop gain approaches zero because of the s term in the feedback factor; the closed-loop gain therefore approaches the forward-path gain $\mu_{N-1}\mu_N$. Initially the loop gain increases at 20 dB/decade, and when the loop gain exceeds unity the closed-loop gain picks up the asymptote of the feedback factor $1/s\tau_F$. At frequencies above $1/\tau_0$ the forward-path gain falls at 40 dB/decade; loop gain therefore falls at 20 dB/decade, and reaches unity at $1/\tau_X$ where the closed-loop gain picks up the 40 dB/decade asymptote of the forward-path. Thus, loop gain rises or falls at 20 dB/decade, and the loop is unconditionally stable. The overall mid-band gain is $\mu_{N-1}\mu_N$ with poles at $\tau_X/\tau_0^2$ and $1/\tau_X$.

Figure 5:
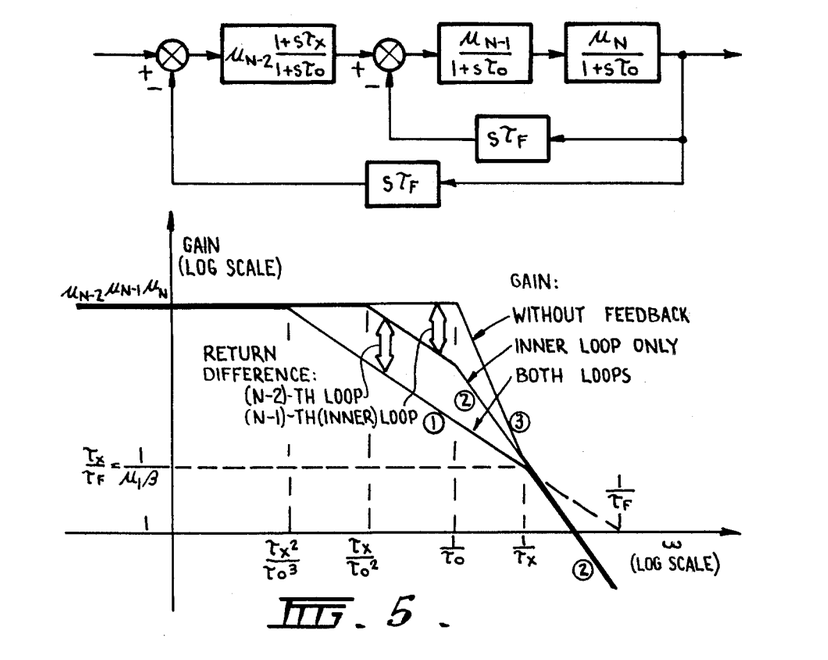
FIG. 5 is a graph showing the gain asymptotes of stages N-2, N-1 and N of the low-pass form of a preferred embodiment, on a log scale.

FIG. 5 shows the gain asymptotes of stage N−2, (stages N−1 and N with the inner feedback factor), and the (N−2)-th feedback factor. The zero of stage N−2 cancels the pole at $1/\tau_X$ from stages N−1 and N, so the forward-path gain of the (N−2)-th loop is a two-pole function: mid-band gain $\mu_{N-2}\mu_{N-1}\mu_N$ with poles $\tau_X/\tau_0^2$ and $1/\tau_0$. At low frequencies the loop gain approaches zero because of the s term in the feedback factor. Loop gain increases at 20 dB/decade for frequencies between zero and the forward-path pole $\tau_X/\tau_0^2$, then remains constant until the pole at $1/\tau_0$, after which it falls at 20 dB/decade towards unity at $1/\tau_X$. Thus the (N−2)-th loop is unconditionally stable:

its overall mid-band gain is $\mu_{N-2}\mu_{N-1}\mu_N$, with poles at $\tau_X^2/\tau_0^3$ and $1/\tau_X$.

The process of adding another stage and feedback factor can be repeated indefinitely. In each case the resulting closed-loop gain is a two-pole function, with the second pole at $1/\tau_X$. The gain around each loop (with all internal loops operating) rises or falls at 20 dB/decade, so each loop is unconditionally stable.

Figure 6:
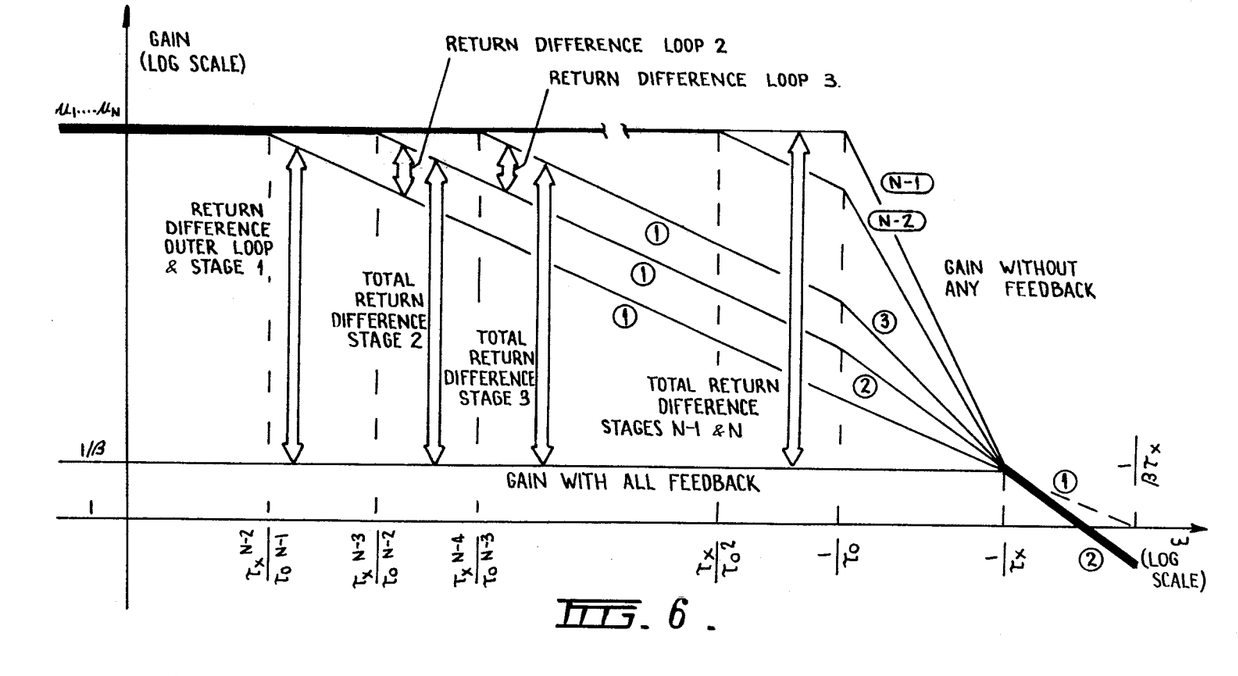
FIG. 6 is a graph showing the gain asymptotes of an outer feedback loop and the nest of differentiating feedback loops of the low-pass form of a preferred embodiment, on a log scale, FIGS. 7 (a) and (b) each show a block diagram of a different embodiment of the low-pass form of the invention wherein the nest of feedback loops is centered on some stage other than the output stage.

FIG. 6 shows the gain asymptotes of the outer loop. The overall mid-band gain is closely $1/\beta$ with a 40 dB/decade roll-off above $1/\tau_X$; the transient response is half-critically damped.

The output-stage return difference is the product of the return differences of all the loops. At low frequencies the asymptote is $$F_N = 1 + \mu_1\mu_2 \ldots \mu_N\beta = 1 + [\tau_0/\tau_X]^{N-1}. \quad (12)$$

This asymptote is constant at frequencies up to $1/\tau_0$, and then falls at 20 (N−1) dB/decade towards unity at $1/\tau_X$. Comparison with FIG. 2 and Eq. 5 shows the advantage of the multi-loop structure. For example, in a single-loop amplifier having $\tau_0=10\mu$ sec and $\tau_X=1\mu$ sec, the return difference F at $\omega=10^5$ radian/sec cannot exceed 11. For the new multi-loop structure, with the same time constants and having three loops, F is 1001.

The k-th-stage return difference is also $$F_K = 1 + \mu_1\mu_2 \ldots \mu_N\beta \quad (13)$$

at low frequencies. However its asymptote falls at 20 dB/decade between $\tau_X^{N-1-k}/\tau_0^{N-k}$ and $1/\tau_0$, and thereafter falls at 20 k dB/decade towards unity at $1/\tau_X$.

It will be appreciated that changes can be made to the block diagram of FIG. 3 without departing from the spirit of the invention. For example:

(a) The poles and zeros of the individual stages, $\tau_0$ and $\tau_X$, need not all be equal.

(b) These poles and zeros could be controlled by additional feedback loops around the stages concerned.

(c) The "stages" need not be single amplifying devices, but may be complete sub-amplifiers that include several amplifying devices.

(d) The feedback time constants $\tau_F$ need not all be equal.

(e) The feedback networks need not be perfect differentiators, but may be LRC networks that give approximate differentiation over a range of signal frequencies.

(f) The overall feedback network $\beta$ need not be a simple divider, but may include reactive elements to modify the response of the amplifier.

Figure 7A:
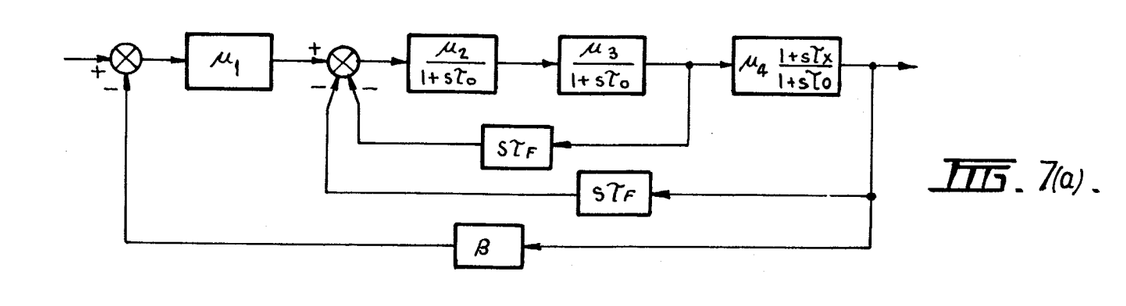
Figure 7B:
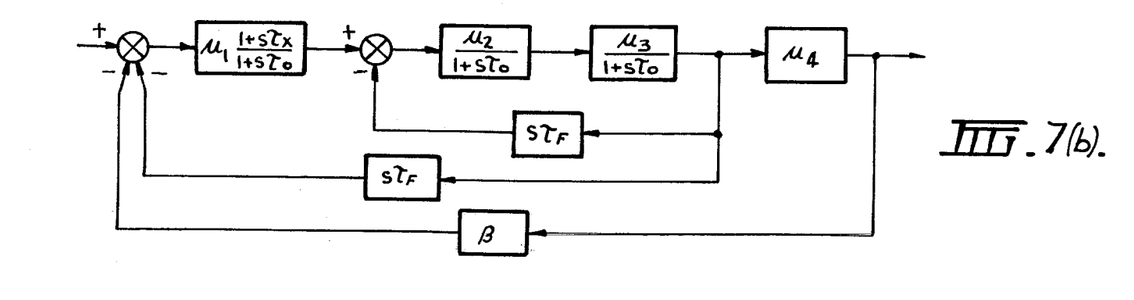

(g) The nest of differentiating feedback loops need not be centered on the output and driver stages, but may be centered on any stage that contributes substantially to total nonlinearity. FIGS. 7(a) and (b) show two possible ways in which the nest may be centered on the second and third stages of a four-stage amplifier.

(h) FIG. 3 and all the foregoing theory is for a low-pass amplifier. The invention can also be applied to high-pass, band-pass, and band-stop amplifiers through well known mathematical transformations and hardware realizations viz.:

low pass→high-pass $s\tau \to 1/s\tau$ low pass→band-pass $s\tau \to [s\tau + 1/s\tau]$ low pass→band-stop $s\tau \to 1/[s\tau + 1/s\tau]$ It will be realised therefore that for a high-pass amplifier, the differentiators of the low-pass amplifier will be replaced by integrators. Again, in band-pass amplifiers, capacitors of the low-pass amplifiers will be replaced by parallel inductor-capacitor combinations and so on.

(i) It will also be realized that the invention is applicable to signal processing systems other than electronic amplifier systems, for example the invention is applicable to a magnetic amplifier system, a hydraulic amplifier system, a pneumatic amplifier system, a mechanical amplifier system or any like signal processing system.

Figure 8:
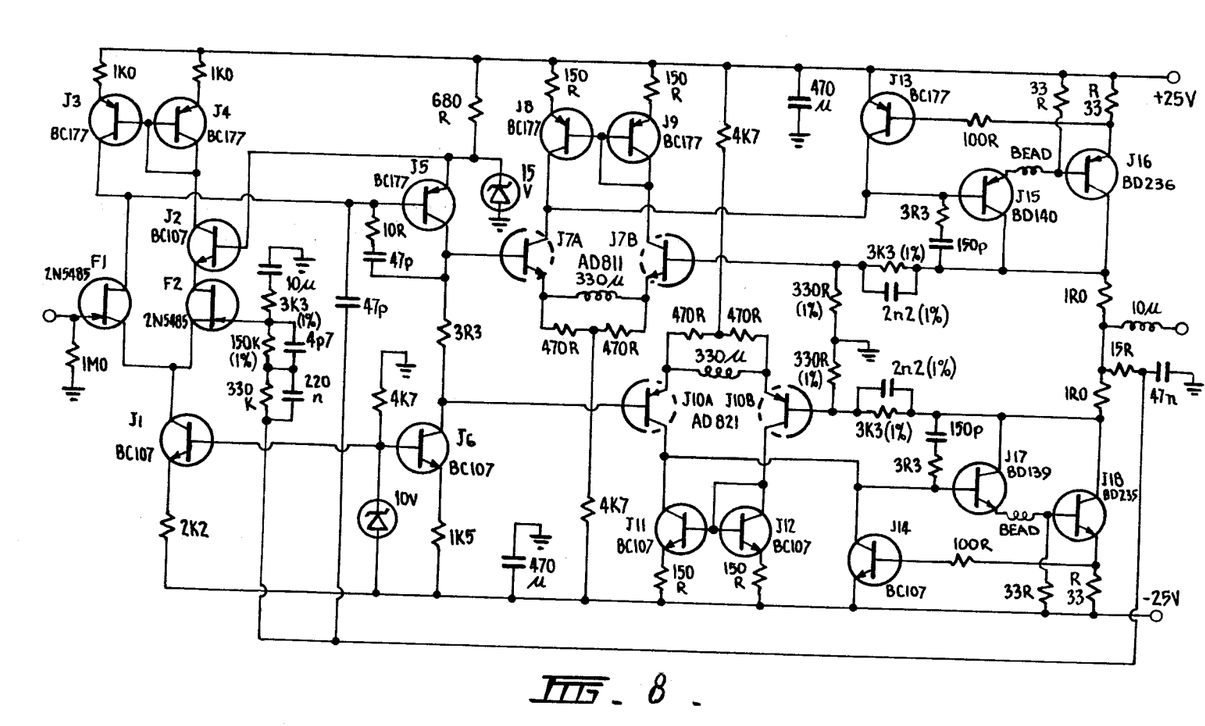
FIG. 8 is the circuit of a practical amplifier embodying the new invention.

FIG. 8 illustrates an embodiment of the invention applied to a practical audio power amplifier.

The circuit is a multi-loop structure of the form shown in FIG. 3, having N=4, $\beta \approx 1/50$, and $\tau_0 \approx 7.5$ $\mu$sec. The correspondence between FIGS. 3 and 8 is as follows:

(a) Stage 1 corresponds to $F_1$ and $F_2$, and has no significant poles or zeros.

(b) Stage N−2 or 2 corresponds to $J_5$, and has its pole set by 47 pF between collector and base.

(c) Stage N−1 or 3 corresponds to $J_7$ or $J_{10}$, and has its pole set by 330 $\mu$H in the emitter circuit. Two transistors are necessary because operation is class-B push-pull.

(d) Stage N or 4 corresponds to Darlington transistors $J_{15+16}$ or $J_{17+18}$, and has its pole set by 150 pF between collector and base. Operation is push-pull.

(e) Outer or overall feedback factor $\beta$ corresponds to 3.3 k$\Omega$ and 150 k$\Omega$ in $F_2$ gate circuit.

(f) Differentiating feedback factor N−2 or 2 corresponds to 47 pF between $J_5$ base and the output circuit.

(g) Differentiating feedback factor N−1 or 3 corresponds to 2.2. nF between $J_{15+16}$ or $J_{17+18}$ collector and $J_7$ or $J_{10}$ base. Operation is push-pull.

The biasing circuit for the class-B output stage is somewhat unusual for audio amplifiers in that it does not rely on some form of thermal feedback. The quiescent current in this stage is related to the quiescent current in $J_6$ via ratios between 3.3$\Omega$ in $J_6$ collector circuit, 330$\Omega$ in $J_7$ and $J_{10}$ base circuit 3.3 K$\Omega$ between $J_{15+16}$ or $J_{17+18}$ collectors and $J_7$ or $J_{10}$ bases 1.0$\Omega$ between $J_{15+16}$ and $J_{17+18}$ collectors.

The 10 $\mu$H, 15$\Omega$ and 47 $\eta$F in the output circuit prevent RF interference, picked up on the loudspeaker leads being fed into the low-level parts of the amplifier.

What is claimed is:

1. A low pass feedback amplifier system, comprising:
a multi-stage amplifier constituting the forward path of the low pass feedback amplifier system, said amplifier having a plurality of stages operatively connected in cascade, said stages having respective predetermined gains, poles, and zeros; and at least two feedback networks operatively connected to said forward path to form a set of nested feedback loops, said loops being nested one within the next, each said feedback network having a predetermined transfer function in complex frequency notation of the approximate form $s\tau$, and wherein the gains, poles and zeros of the individual stages of the forward path, and the transfer functions of the feedback networks are predetermined such that the stage or stages within the innermost of the feedback loops has a return difference which changes at a rate greater than Bode's limit for unconditional stability.

2. The feedback amplifier system of claim 1 wherein the poles and zeros of the individual stages of said forward path and the transfer functions of said feedback networks are predetermined such that each feedback loop, with all other loops enclosed by it operating, is unconditionally stable.

3. The feedback amplifier system of claim 1, wherein said feedback networks comprise LRC networks.

4. The feedback amplifier system of claim 1, further comprising an additional feedback network operatively connected to said forward path to form an additional feedback loop outside said nested feedback loops.

5. The feedback amplifier system of claim 4, wherein said additional feedback network comprises any arbitrary LRC network.

6. The feedback amplifier system of claim 4, wherein said additional feedback network comprises a simple divider network.

7. The feedback amplifier system of claim 4, wherein a portion of the forward path is included in the innermost feedback loop, said portion having two dominant poles.

8. The feedback amplifier system of claim 4, wherein a portion of the forward path is included between two adjacent differentiating feedback networks of the nest, said portion having one dominant pole and one dominant zero.

9. The feedback amplifier system of claim 8, wherein all dominant poles are coincident.

10. The feedback amplifier system of claim 8, wherein all dominant zeros are coincident.

11. The feedback amplifier system of claim 4, wherein a portion of the forward path is included between an outermost differentiating feedback loop of said nest and said additional feedback network, said portion having no significant poles or zeros.

12. The feedback amplifier system of claim 4, wherein all said differentiating feedback networks have the same time constant.

13. The feedback amplifier system of claim 1, wherein said amplifier includes a final stage comprising an output stage, said nest of feedback loops being centered on the output stage.

14. The feedback amplifier system of claim 1, wherein said amplifier includes a final stage comprising an output stage, said nested feedback loops being centered on any stage other than the output stage.

15. The feedback amplifier system of claim 1, wherein the gain around each said feedbck loop, with all other loops enclosed by it operating, rises or falls at 20 dB/decade when the magnitude of said gain around each said feedback loop is greater than unity.

16. A high pass feedback amplifier system, comprising:

a multi-stage amplifier constituting the forward path of the high pass feedback amplifier system, said amplifier having a plurality of stages operatively connected in cascade, said stages having respective predetermined gains, poles, and zeros; and at least two feedback networks operatively connected to said forward path to form a set of nested feedback loops, said loops being nested one within the next, each said feedback network having a predetermined transfer function in complex frequency notation of the approximate form $1/s\tau$, and wherein the gains, poles and zeros of the individual stages of the forward path, and the transfer functions of the feedback networks are predetermined such that the stage or stages within the innermost of the feedback loops has a return difference which changes at a rate greater than Bode's limit for unconditional stability.

17. The feedback amplifier system of claim 16, wherein the poles and zeros of the individual stages of said forward path and the transfer functions of said feedback networks are predetermined such that each feedback loop, with all other loops enclosed by it operating, is unconditionally stable.

18. The feedback amplifier system of claim 16, wherein said feedback networks comprise LRC networks.

19. The feedback amplifier system of claim 16, further comprising an additional feedback network operatively connected to said forward path to form an additional feedback loop outside said nest of feedback loops.

20. The feedback amplifier system of claim 19, wherein said additional feedback network comprises any arbitrary LRC network.

21. The feedback amplifier system of claim 19, wherein said additional feedback network comprises a simple divider network.

22. The feedback amplifier system of claim 16, wherein said amplifier includes a final stage comprising an output stage, said nest of feedback loops being centered on the output stage.

23. The feedback amplifier system of claim 16, wherein said amplifier includes a final stage comprising an output stage, said nest of feedback loops being centered on any stage other than the output stage.

24. The feedback amplifier system of claim 16, wherein the gain around each feedback loop, with all other loops enclosed by it operating, rises or falls at 20 dB/decade when the magnitude of said gain around each said feedback loop is greater than unity.

25. A band pass feedback amplifier system comprising:

a multi-stage amplifier constituting the forward path of the band pass feedback amplifier system, said amplifier having a plurality of stages operatively connected in cascade, said stages having respective predetermined gains, poles, and zeros; and at least two feedback networks operatively connected to said forward path to form a set of nested feedback loops, said loops being nested one within the next, each said feedback network having a predetermined transfer function in complex frequency notation of the approximate form $(s\tau + 1/s\tau)$, and wherein the gains, poles and zeros of the individual stages of the forward path, and the transfer functions of the feedback networks are predetermined such that the stage or stages within the innermost of the feedback loops has a return difference which changes at a rate greater than Bode's limit for unconditional stability.

26. The feedback amplifier system of claim 25, wherein the poles and zeros of the individual stages of said forward path and the transfer functions of said feedback networks are predetermined such that each feedback loop, with all other loops enclosed by it operating, is unconditionally stable.

27. The feedback amplifier system of claim 25, wherein said feedback networks comprise LRC networks.

28. The feedback amplifier system of claim 25, further comprising an additional feedback network operatively connected to said forward path to form an additional feedback loop outside said nested feedback loops.

29. The feedback amplifier system of claim 28, wherein said additional feedback network comprises any arbitrary LRC network.

30. The feedback amplifier system of claim 28, wherein said additional feedback network comprises a simple divider network.

31. The feedback amplifier system of claim 25, wherein said amplifier includes a final stage comprising an output stage, said nest of feedback loops being centered on the output stage.

32. The feedback amplifier system of claim 25, wherein said amplifier includes a final stage comprising an output stage, said nested feedback loops being centered on any stage other than the output stage.

33. A band stop feedback amplifier system, comprising:
a multi-stage amplifier constituting the forward path of the band stop feedback amplifier system, said amplifier having a plurality of stages operatively connected in cascade, said stages having respective predetermined gains, poles, and zeros; and
at least two feedback networks connected to said forward path to form a set of nested feedback loops, said loops being nested one within the next, each said feedback network having a predetermined transfer function in complex frequency notation of the approximate form $1/(s\tau + 1/s\tau)$, and
wherein the gains, poles and zeros of the individual stages of the forward path, and the transfer functions of the feedback networks are predetermined such that the stage or stages within the innermost of the feedback loops has a return difference which changes at a rate greater than Bode's limit for unconditional stability.

34. The feedback amplifier system of claim 33, wherein the poles and zeros of the individual stages of said forward path and the transfer functions of said feedback networks are predetermined such that each feedback loop; with all other loops enclosed by it operating, is unconditionally stable.

35. The feedback amplifier system of claim 34, further comprising an additional feedback network operatively connected to said forward path to form an additional feedback loop outside nested feedback loops.

36. The feedback amplifier system of claim 35, wherein said additional feedback network comprises any arbitrary LRC network.

37. The feedback amplifier system of claim 35, wherein said additional feedback network comprises a simple divider network.

38. The feedback amplifier system of claim 33, wherein said feedback networks comprise LRC networks.

39. The feedback amplifier system of claim 33, wherein said amplifier includes a final stage comprising an output stage, said nested feedback loops being centered on the output stage.

40. The feedback amplifier system of claim 33, wherein said amplifier includes a final stage comprising an output stage, said nested feedback loops being centered on any stage other than the output stage.

41. A low pass feedback amplifier system, comprising:
a multi-stage low pass amplifier constituting a forward path of the low pass feedback amplifier system, said amplifier having N stages designated 1 through N operatively connected in cascade, said N stages having respective predetermined gains designated as $\mu 1$ through $\mu N$, stages 2 through N each having a dominant pole of time constant $\tau_o$, stages 2 through N-2 each having a dominant zero of time constant $\tau_x$;
a plurality of feedback networks operatively connected to said forward path to form inner and outer nested feedback loops, each said feedback loop having a predetermined transfer function in complex frequency notation of the approximate form $s\tau_F$, and each said feedback network feeding back to an input of one of stages 2 through N-1 a time derivative of an output from stage N; and
an additional feedback network operatively connected to feed back a fraction $\beta$ of said output from stage N to an input of stage 1, and
wherein the following inter-relations apply approximately:

$$\mu_k = \tau_0/\tau_X$$

for $$2 < K < N-2$$

$$\mu_1 \mu_{N-1} \mu_N \beta = (\tau_0/\tau_X)^2$$

$$\tau_F = \mu_1 \beta \tau_X.$$

42. The feedback amplifier system of claim 41, wherein said plurality of feedback networks comprise LRC networks.

* * * * *